(12) United States Patent
Lynn et al.

(10) Patent No.: US 6,501,409 B1
(45) Date of Patent: Dec. 31, 2002

(54) SWITCHED-CAPACITOR DAC/CONTINUOUS-TIME RECONSTRUCTION FILTER INTERFACE CIRCUIT

(75) Inventors: Lapoe Lynn, Cupertino, CA (US); Samuel W. Sheng, San Jose, CA (US); Chih-Jen Hung, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/881,570

(22) Filed: Jun. 13, 2001

(51) Int. Cl.[7] .......................... H03M 1/66; H03M 1/72
(52) U.S. Cl. ...................... 341/150; 341/146
(58) Field of Search ................. 341/120, 155, 341/161, 172, 143, 144, 146, 51, 150; 348/554; 327/558; 375/350

(56) References Cited

U.S. PATENT DOCUMENTS 5,798,724 A * 8/1998 Myers ...................... 341/146
6,201,438 B1 * 3/2001 Nicollini et al. ............ 327/558
6,215,431 B1 * 4/2001 Sheng et al. ................ 341/144

* cited by examiner

*Primary Examiner*—Patrick Wamsley
(74) *Attorney, Agent, or Firm*—Thelen Reid & Priest LLP (57) ABSTRACT

A circuit includes a switched-capacitor array for converting a digital signal into a corresponding amount of electric charge, a switching circuit, and a continuous-time reconstruction filter circuit. The switched-capacitor array includes a plurality of capacitors and a summing node to which the plurality of capacitors are connected. The switching circuit is coupled between the summing node and the continuous-time reconstruction filter circuit, and supplies a pulsed current signal to the continuous-time reconstruction filter circuit. The circuit may further include a gain stage coupled between the summing node and the switching circuit, for controlling a gain of the pulsed current signal. The gain stage may include a coupling capacitor. A digital signal is supplied to the switched capacitor array and converted into a corresponding amount of electric charge. The electric charge is supplied as a pulsed current signal to the continuous-time reconstruction filter circuit without converting into a voltage signal.

20 Claims, 8 Drawing Sheets

$R = \dfrac{1}{\omega C_s}$   $\omega$ = Sampling Frequency

SWITCHED-CAPACITOR DAC/CONTINUOUS-TIME RECONSTRUCTION FILTER INTERFACE CIRCUIT

FIELD OF THE INVENTION

The present invention relates to broadband telecommunications. More particularly, the present invention relates to a circuit interfacing a digital-to-analog converter (DAC) and a continuous-time reconstruction filter in a broadband telecommunication system.

BACKGROUND OF THE INVENTION

Figure 1:
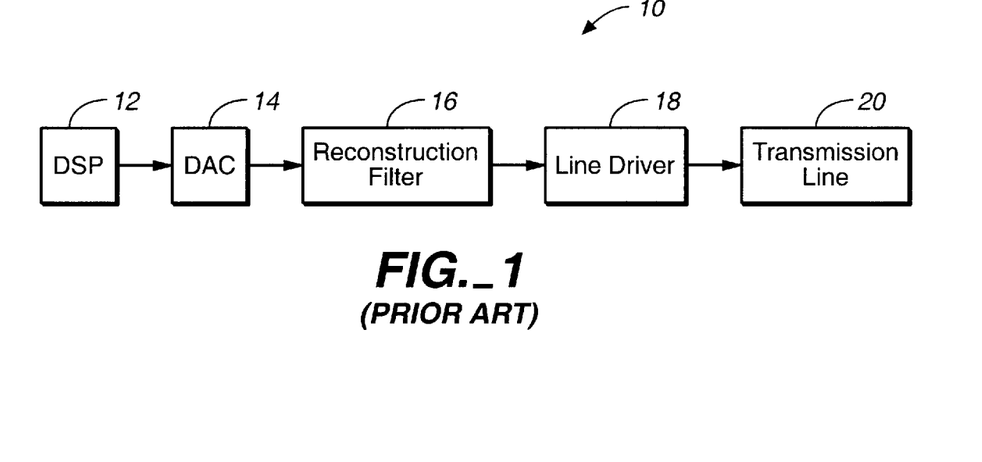
FIG. 1 is a block diagram schematically illustrating a conventional transmission path for a typical broadband telecommunications system.

FIG. 1 schematically illustrates a typical transmission path 10 for a broadband telecommunications system, such as an asymmetric digital subscriber line (ADSL) system. Digital data is sent from a digital signal processing (DSP) unit 12, such as an encoder, to a digital-to-analog converter (DAC) 14. The analog output of the DAC 14 represents a modulated signal that is to be transmitted on a transmission line 20 such as a telephone line (or twisted-pair copper line). Since the operation of an actual DAC is not ideal, the analog output of the DAC 14 generally contains a large amount of spurious, out-of-band harmonics generated by the zero-order hold nature of the DAC. Thus, a reconstruction filter 16 is used to reduce or substantially eliminate the out-of-band harmonics. The reconstructed transmit signal is input to a line driver 18. The line driver 18 provides sufficient power to the signal to drive the transmission line.

Figure 2:
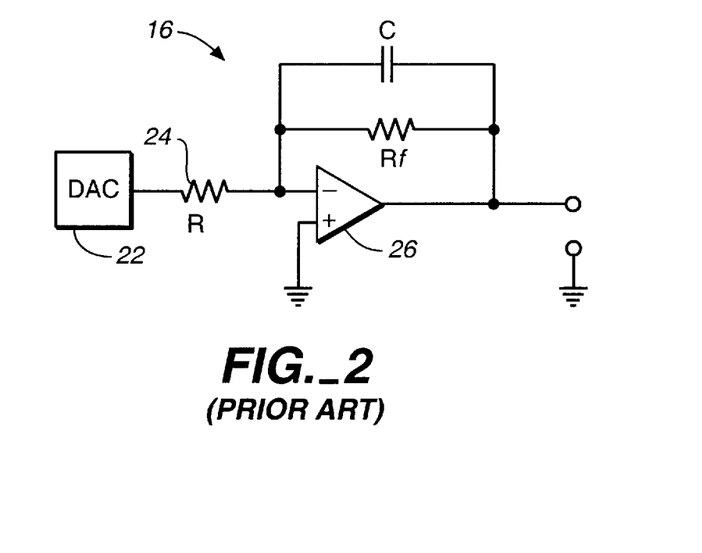
FIG. 2 is an electrical schematic diagram illustrating the basic structure of a typical reconstruction filter.
Figure 3A:
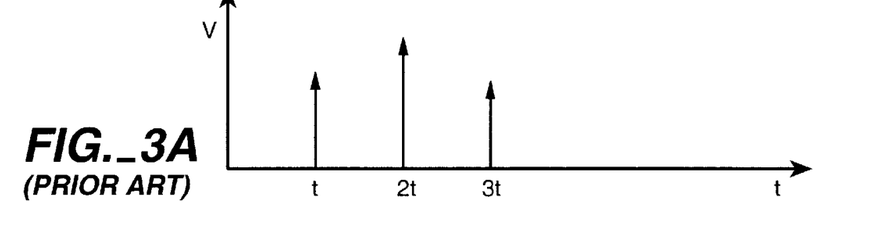
FIG. 3A is a diagram schematically illustrating an ideal output signal of a conventional DAC.
Figure 3B:
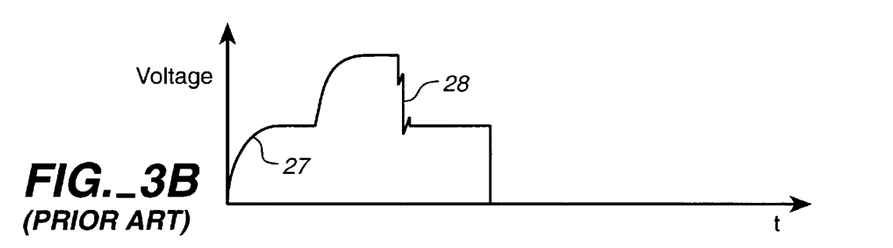
FIG. 3B is a diagram schematically illustrating an actual output signal of a conventional DAC.

FIG. 2 schematically illustrates the basic structure of a typical reconstruction filter 16. As shown in FIG. 2, the reconstruction filter 16 is configured as a low-pass filter circuit, and includes an amplifier 26, a feedback resistor Rf and a capacitor C. The output of the DAC 22 is input via an input resistor 24 to the amplifier 24. However, since the operation of the DAC 14 is inherently discrete time in nature, its analog output is typically distorted from the ideal form of an impulse voltage signal shown in FIG. 3A. FIG. 3B schematically illustrates an actual analog output of the DAC 14. As shown in FIG. 3B, the actual analog output includes distortions such as stewing 27 and glitching 28. In addition, a zero-order held waveform of the DAC 14 causes a frequency dependent droop across the output band, which requires a costly correction by means of digital processing before the DAC 14 or within the subsequent analog filter.

Figure 4:
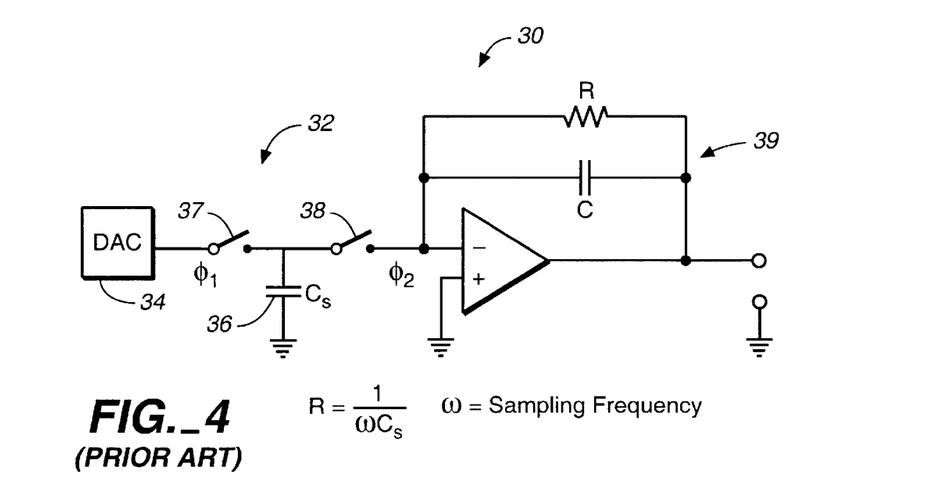
FIG. 4 is an electrical schematic diagram illustrating a typical reconstruction filter having an input sampling circuit.

In order to solve these problems associated with the DAC analog output distortions, a reconstruction filter having an input sampling circuit was proposed in the U.S. Pat. No. 6,215,431, entitled DROOP-FREE QUASI-CONTINUOUS RECONSTRUCTION FILTER INTERFACE, issued on Apr. 10, 2001, which is hereby incorporated herein by reference as if set forth fully herein. FIG. 4 schematically illustrates a typical reconstruction filter 30 having an input sampling circuit 32. Instead of inputting the analog voltage signal via the input resistor 24 (FIG. 2), the DAC output is resampled by the input sampling circuit 32 before being supplied to a low-pass filter portion 39. As shown in FIG. 4, the input sampling circuit 32 includes a sampling capacitor 36, a sampling switch 37, and an input switch 38.

Figure 3C:
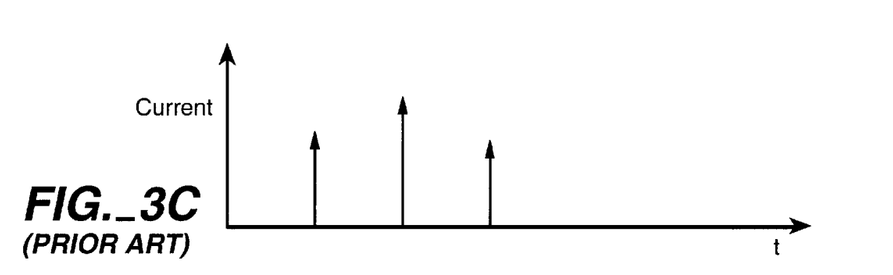
FIG. 3C is a diagram schematically illustrating a resampled signal of a DAC output.

By appropriately selecting the timings of the sampling switch 37 and the input switch 38 with respect to the clock signal of the DAC 34, the analog voltage signal from the DAC 34 is sampled at the point where the DAC 34 has settled to the correct voltage level. The sampled voltage signal is stored in the sampling capacitor 38 and then is effectively "dumped" into the low-pass filter portion 39 as an impulse current signal. FIG. 3C schematically illustrates the current signal from the sampling circuit 32 input to the low-pass filter 39. As shown in FIG. 3C, the impulse current signal approximates the ideal output signal of the DAC shown in FIG. 3A.

Figure 5:
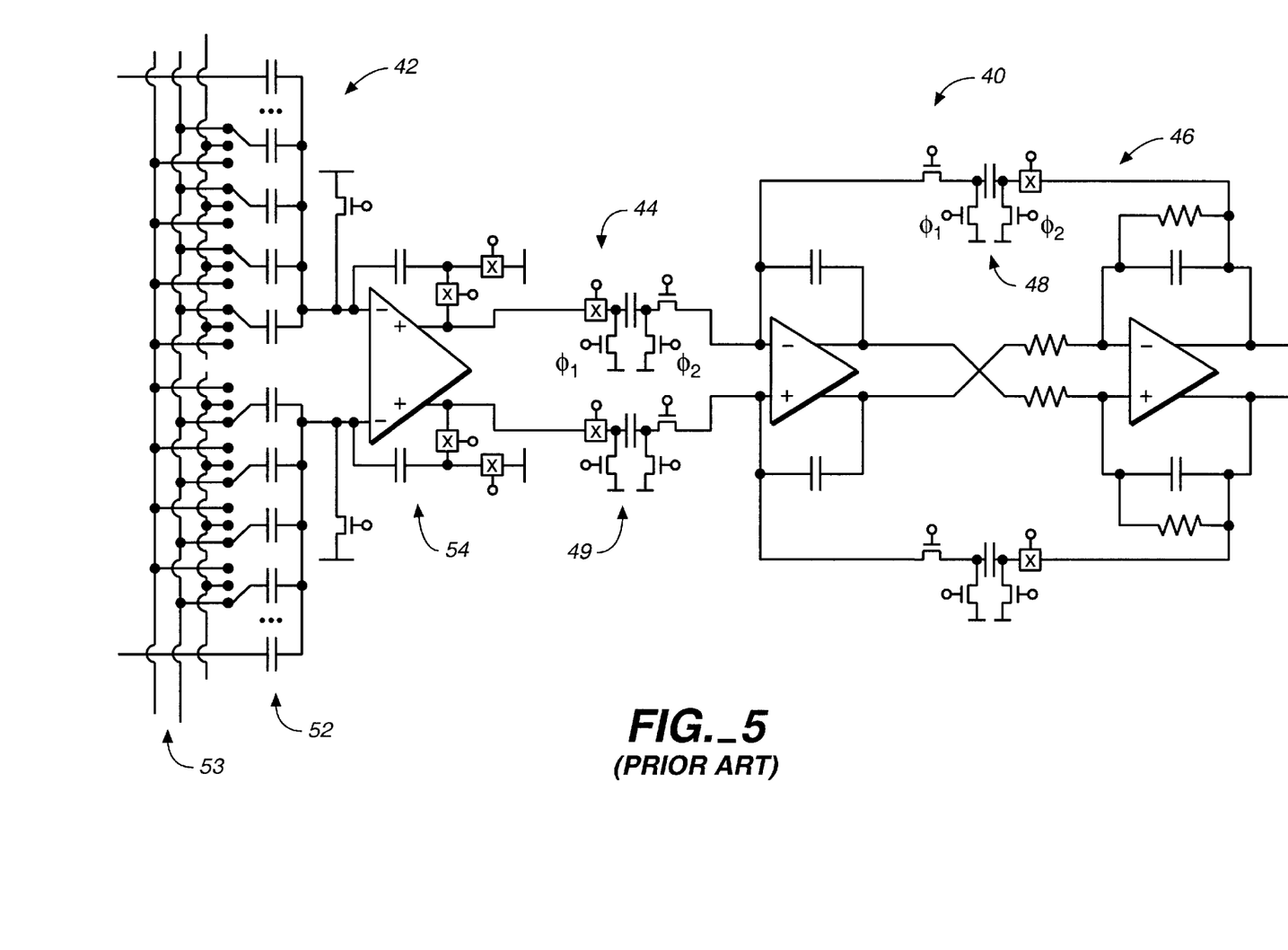
FIG. 5 is an electrical schematic diagram illustrating a circuit structure of a resampling reconstruction filter for a conventional switched-capacitor DAC.

FIG. 5 illustrates an example of circuit implementation of a reconstruction filter 40 with the resampling feature for a traditional switched-capacitor DAC 42. As shown in FIG. 5, the conventional switched-capacitor voltage-mode DAC 42 includes a capacitor array 52 controlled by a digital word, and an amplifier 54 for converting the charge from the capacitor array into an analog voltage signal. The digital word is supplied via one or more DAC references 53. The reconstruction filter 40 includes a sampling circuit 44 and a low-pass filter 46. The low-pass filter 46 is of a quasi-continuous nature, including a switched capacitor 48 in its feedback path which is synchronized with the sampling capacitor 49.

In a typical arrangement in the transmission path, as shown in FIG. 5, the switched-capacitor DAC 42 is followed by a reconstruction filter 40. Thus, an amplifier is required for the DAC 42 to generate an analog voltage signal, as well as amplifiers required in the reconstruction filter 40. However, more amplifiers consume more power in the system, and in some applications, power saving is very important. Accordingly, it would be desirable to provide an interface circuit for a reconstruction filter which can provide an impulse signal approximating the ideal DAC output and requires less power than prior art circuits.

BRIEF DESCRIPTION OF THE INVENTION

A circuit includes a switched-capacitor array for converting a digital signal into a corresponding amount of electric charge, a switching circuit, and a continuous-time reconstruction filter circuit. The switched-capacitor array includes a plurality of capacitors and a summing node to which the plurality of capacitors are connected. The switching circuit is coupled between the summing node and the continuous-time reconstruction filter circuit, and supplies a pulsed current signal to the continuous-time reconstruction filter circuit. The circuit may further include a gain stage coupled between the summing node and the switching circuit, for controlling a gain of the pulsed current signal. The gain stage may provide a variable gain. The gain stage may include a coupling capacitor which may be programmable. A digital signal is supplied to the switched capacitor array and converted into a corresponding amount of electric charge. The electric charge is supplied as a pulsed current signal to the continuous-time reconstruction filter circuit without converting into a voltage signal.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of a DAC/continuous-time filter interface circuit. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 6:
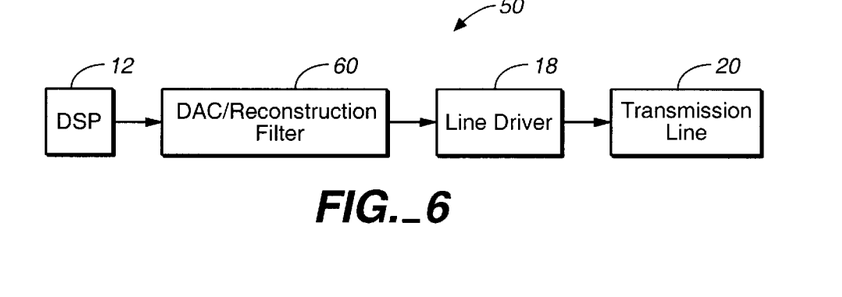
FIG. 6 is a block diagram schematically illustrating a transmission path for a broadband communications system in accordance with the present invention.

FIG. 6 schematically illustrates a transmission path 50 of a broadband telecommunications system such as an asymmetric digital subscriber line (ADSL) system, in accordance with the present invention. Compared with the conventional transmission path 10 (FIG. 1), digital data from a DSP unit 12 is input to a DAC/reconstruction filter circuit 60, rather than processed through the conventional DAC 14 and then input to the reconstruction filter 16.

Figure 7:
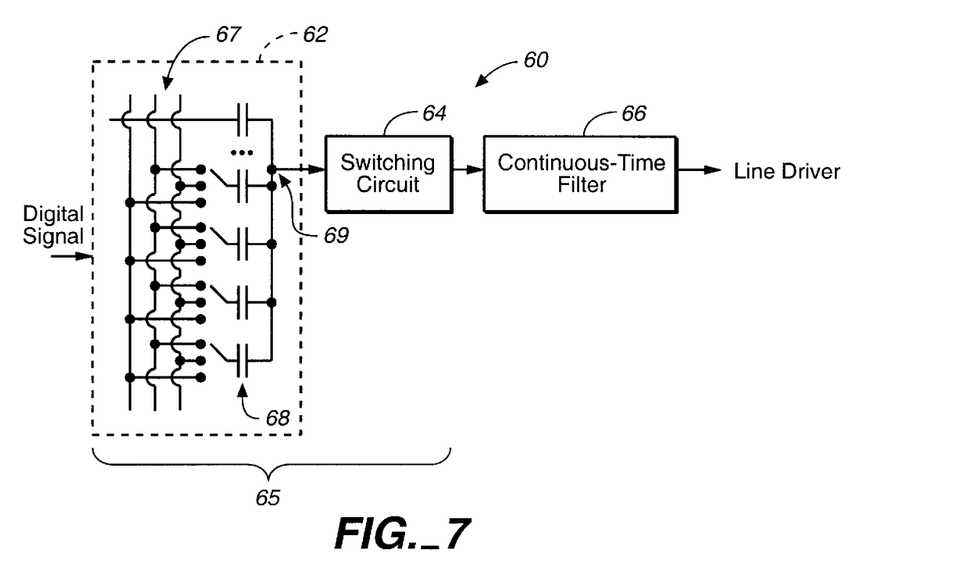
FIG. 7 is a block diagram schematically illustrating a DAC/reconstruction filter circuit in accordance with the present invention.

FIG. 7 is a block diagram schematically illustrating the DAC/reconstruction filter circuit 60. As shown in FIG. 7, the DAC/reconstruction filter circuit 60 includes a switched-capacitor array 62 for converting a digital signal into a corresponding amount of electric charge, a switching circuit 64, and a continuous-time reconstruction filter circuit 66. The switched-capacitor array 62 includes a plurality of capacitors 68 and a summing node 69 to which the plurality of capacitors 68 are connected. The plurality of capacitors 68 are controlled by a digital word which is supplied via one or more DAC references 67. The switching circuit 64 is coupled to the summing node 69, and supplies a pulsed current signal to the continuous-time reconstruction filter circuit 66. According to the present invention, the amplifier in the conventional DAC is eliminated, and the DAC output is coupled to the continuous-time filter 66 via the switching circuit 64 without employing an amplifier or converting the input signal into a voltage mode.

As shown in FIG. 7, in accordance with the present invention, the switched-capacitor array 62 and the switching circuit 64 implements a new DAC interface 65 that interfaces a digital signal (i.e., discrete-time signal) to a continuous-time filter, from which an analog output is obtained. The DAC function, i.e., the digital-to-analog conversion is effectively combined to the continuous-time reconstruction filter 66 via the switching circuit 64, by eliminating the amplifier. Eliminating the amplifier reduces the power required for the transmission path, and also reduces any noise associated with the amplifier in the conventional DAC. In addition, since the switched-capacitor array references see the same load independent of input digital code, linearity is also improved.

It should be noted that although the continuous-time reconstruction filter 66 is typically a low-pass filter, it may be of any type of reconstruction filter, including a passive filter and a quasi-continuous filter. The DAC interface 65 of the present invention can be used for any type of reconstruction filter.

Figure 8:
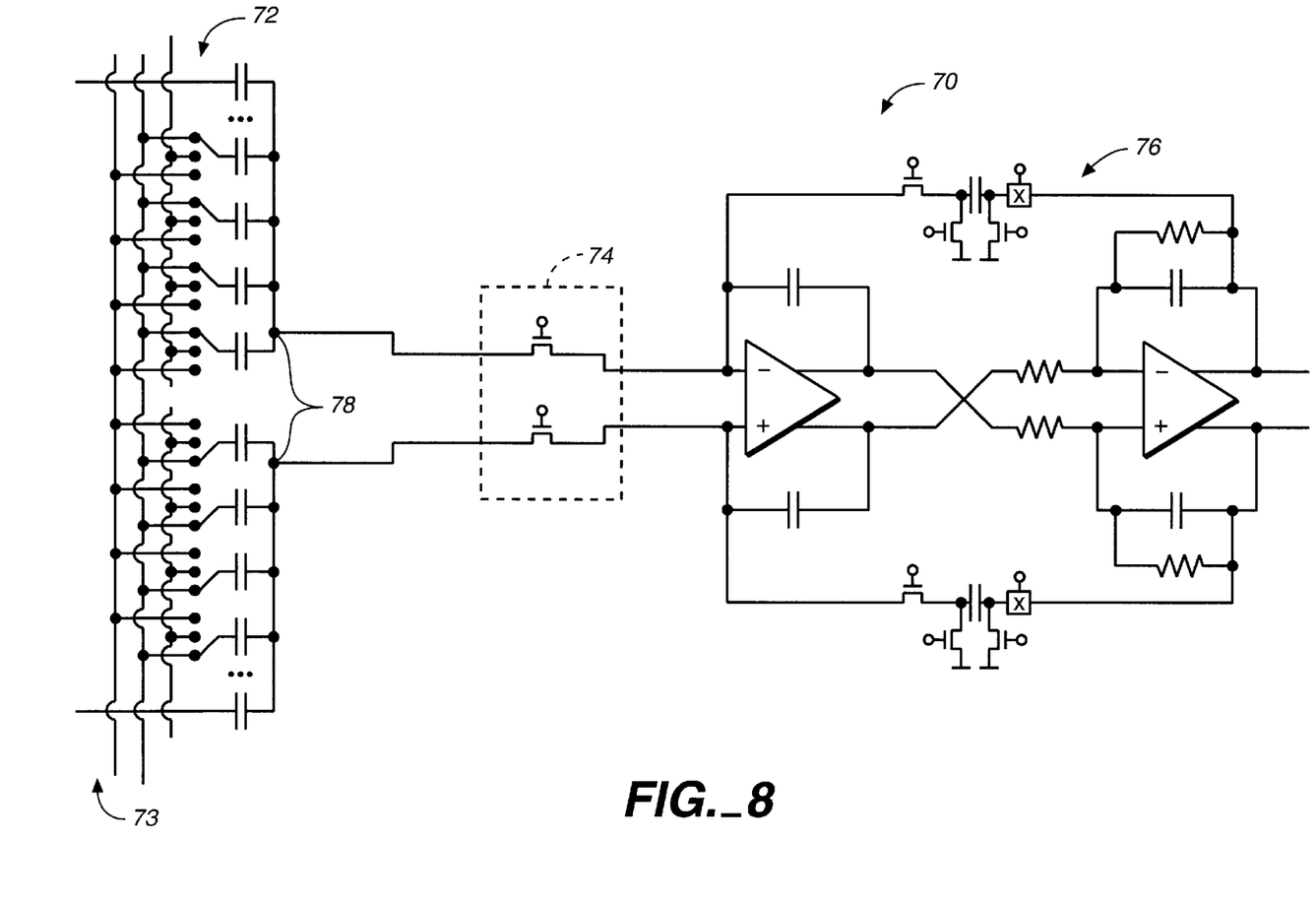
FIG. 8 is an electrical diagram illustrating an example of circuit implementation of a DAC/reconstruction filter circuit in accordance with a specific embodiment of the present invention.

FIG. 8 illustrates an example of circuit implementation of a DAC/reconstruction filter circuit 70 in accordance with a specific embodiment of the present invention. As shown in FIG. 8, the DAC/reconstruction filter circuit 70 includes a switched-capacitor array 72, a switching circuit 74, and a reconstruction filter 76. The switched-capacitor array 72 is controlled by a digital word which is supplied via one or more DAC references 73. The switching circuit 74 has a simple structure and may be implemented with transistors or other switching devices. The switching circuit 74 supplies the electric charge at summing nodes 78 to the reconstruction filter at a predetermined timing which is appropriately set with respect to the clock signal of the switched-capacitor array 72. As a result, a pulsed current signal (current impulse signal such as shown in FIG. 3C) corresponding to the digital signal is input to the reconstruction filter 76.

Figure 9:
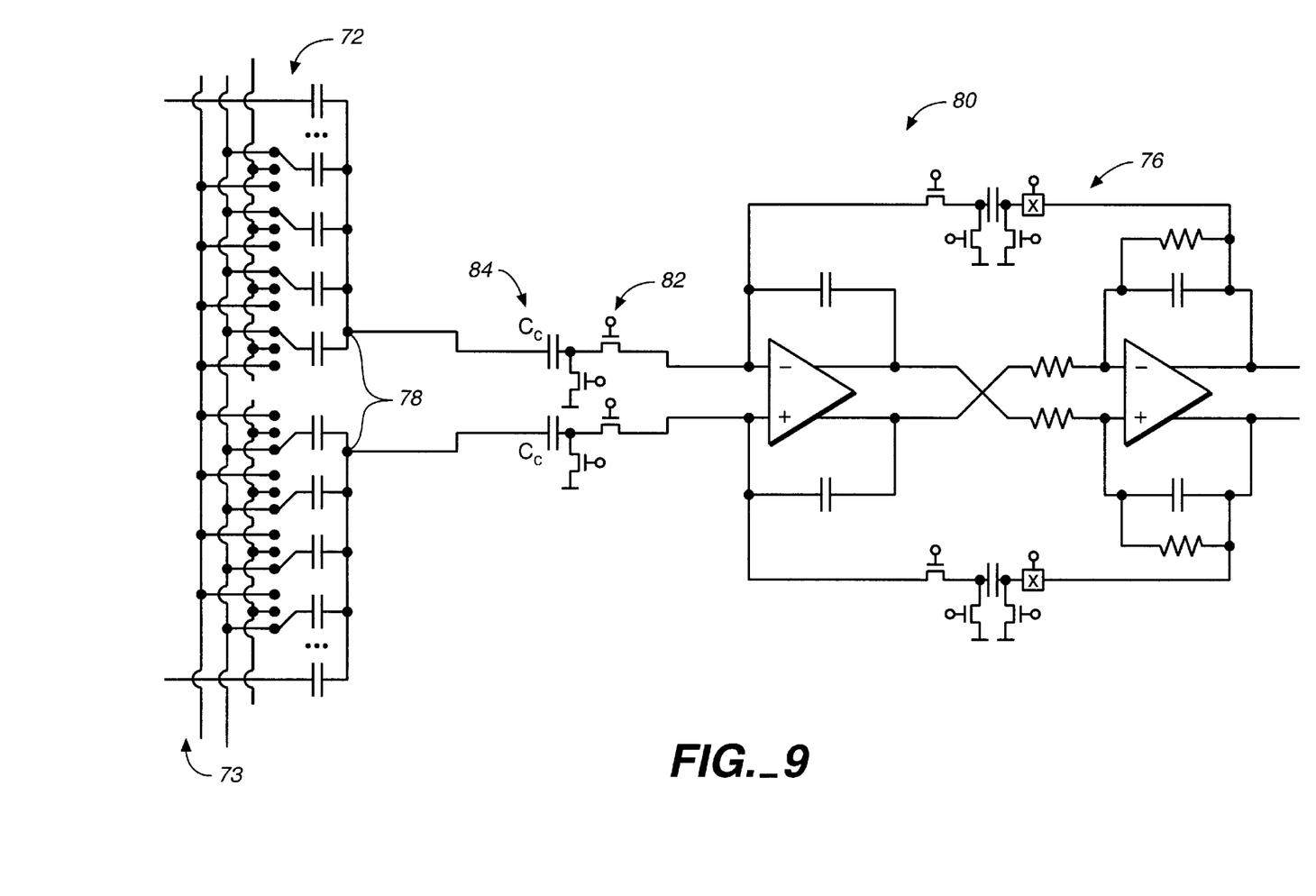
FIG. 9 is an electrical diagram illustrating an example of circuit implementation of a DAC/reconstruction filter circuit in accordance with a specific embodiment of the present invention.

FIG. 9 illustrates another example of circuit implementation of a DAC/reconstruction filter circuit 80 in accordance with a specific embodiment of the present invention. As shown in FIG. 9, the DAC/reconstruction filter circuit 80 includes a switched-capacitor array 72, a switching circuit 82, and a reconstruction filter 76. The switched-capacitor array 72 is controlled by a digital word which is supplied via one or more DAC references 73. The switching circuit 82 may be implemented with transistors or other switching devices.

As shown in FIG. 9, the DAC/reconstruction filter circuit 80 further includes a gain stage 84 coupled between the summing node 78 of the switched capacitor array 72 and the switching circuit 84. The gain stage 84 controls a gain of the pulsed current signal. For example, the gain stage 84 is implemented by coupling capacitors Cc. Since a switched-capacitor DAC generally has a large capacitance, using coupling capacitors Cc can effectively make the DAC capacitance smaller when seen by the reconstruction filter 76. In addition, the coupling capacitors Cc may be programmable, so as to achieve a variable gain coupling to the reconstruction filter 76.

Figure 10A:
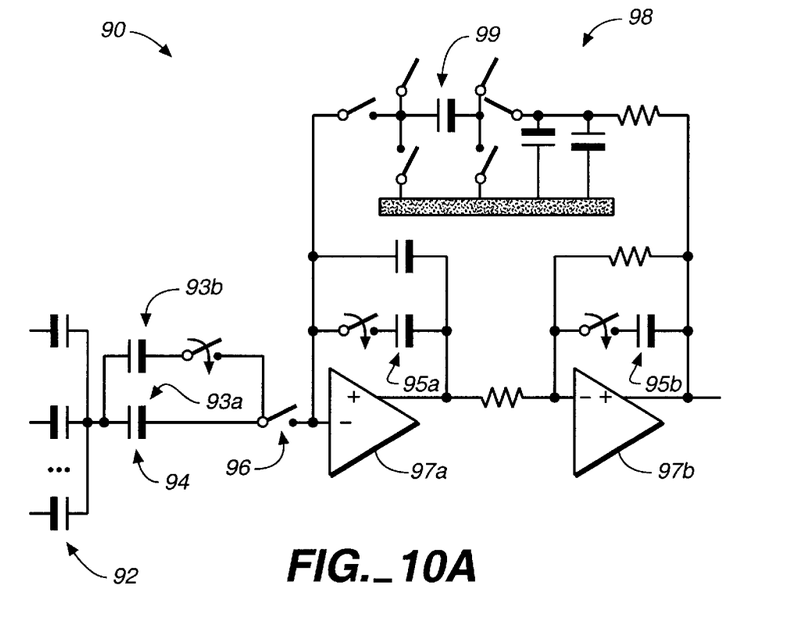
FIG. 10A is an electrical schematic diagram illustrating an implementation of a DAC/reconstruction filter circuit having a variable gain stage in accordance with a specific embodiment of the present invention.

FIG. 10A schematically illustrates an implementation of a DAC/reconstruction filter circuit 90 having a variable gain stage. The DAC/reconstruction filter circuit 90 is shown as a single-ended equivalent for simplicity, but the present invention is equally applicable to a differential structure. As shown in FIG. 10A, the DAC/reconstruction filter circuit 90 includes a switched-capacitor array 92, a gain stage 94, a switching circuit 96, and a reconstruction filter 98. The gain stage 94 includes a primary coupling capacitor 93a and a programmable capacitor array 93b, so that the coupling gain can be attenuated or changed, for example, −6 dB to −18 dB. The reconstruction filter 98 is a biquad filter, and its low-pass filter characteristic is also variable using switched-capacitors 95a and 95b for amplifiers 97a and 97b, respectively. The feedback path also includes a switched-capacitor network 99 that mirrors (or is synchronized with) the switching circuit 96 so that the output of the reconstruction filter 98 has a more accurate gain.

Figure 10B:
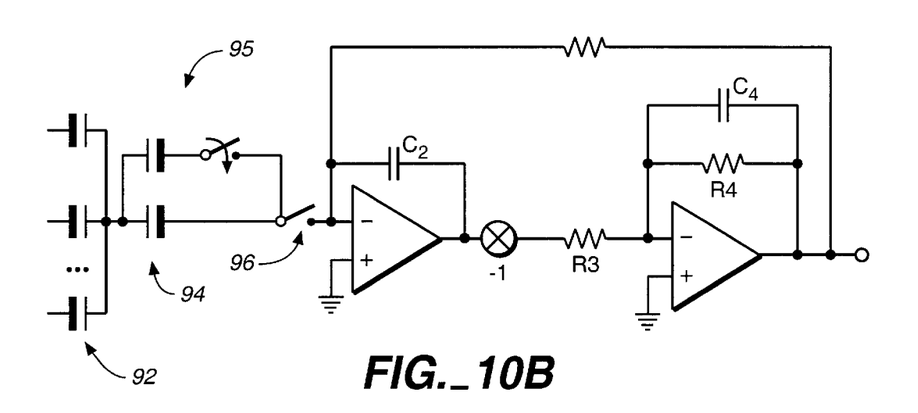
FIG. 10B is an electrical schematic diagram illustrating a DAC interface circuit with a variable gain stage for a reconstruction filter, in accordance with a specific embodiment of the present invention.
Figure 10C:
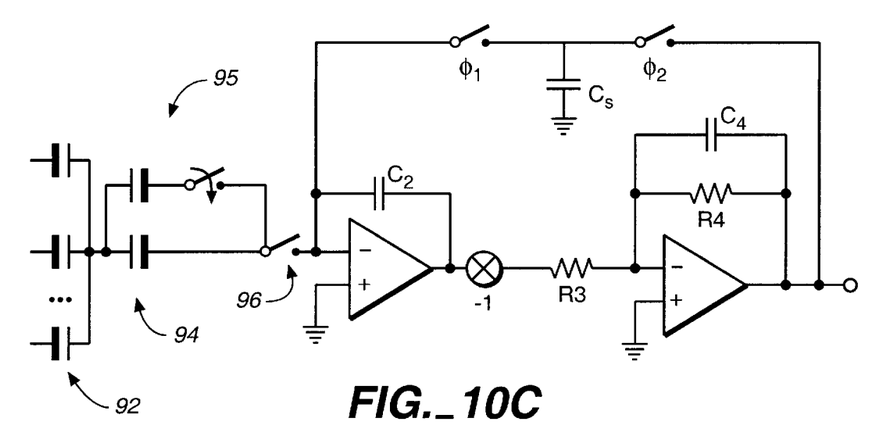
FIG. 10C is an electrical schematic diagram illustrating a DAC interface circuit with a variable gain stage for a reconstruction filter, in accordance with a specific embodiment of the present invention.

It should be noted that the above illustrated structure of the reconstruction filter 98 is merely an example, and the present invention is applicable to any other type of continuous-time or quasi-continuous time low-pass filters, including passive filters without amplifier and feedback path, as mentioned above. FIGS. 10B and 10C show examples of a DAC interface circuit 95 combined with a reconstruction filter of a different configuration in accordance with a specific embodiment of the present invention. In addition, such a reconstruction filter may be adapted to a line driver for ADSL communications.

Figure 11:
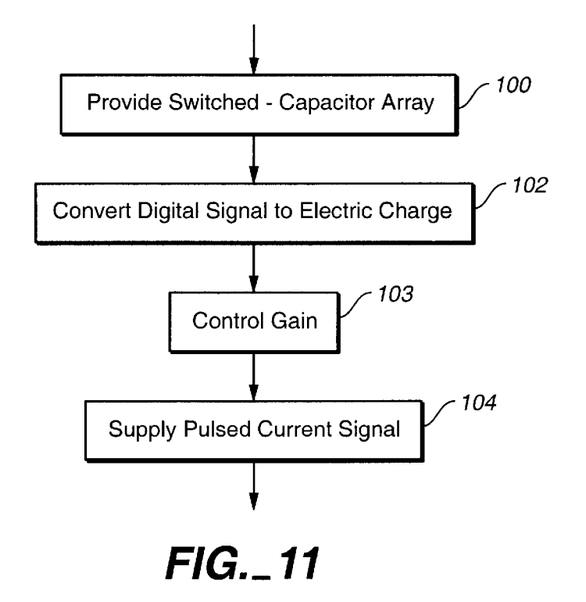
FIG. 11 is a process flow diagram schematically illustrating a method for interfacing a digital signal output and a continuous-time reconstruction filter circuit according to the present invention.

FIG. 11 schematically illustrates a method for interfacing a digital signal output and a continuous-time reconstruction filter circuit according to an embodiment of the present invention. First, a switched-capacitor array is provided (100), which may be a DAC capacitor array. A digital signal, which is typically comes from a DSP, is supplied to the switched capacitor array so as to convert the digital signal into a corresponding amount of electric charge (102). The electric charge is supplied as a pulsed current signal to the continuous-time reconstruction filter circuit without being converted into a voltage signal (104). Since the electric charge is directly supplied to the continuous-time filter, the amplifier required in a conventional DAC can eliminated. In accordance with a specific embodiment of the present invention, a gain of the pulsed current signal may be controlled before supplying to the continuous-time reconstruction filter (103). Such a controlling gain may include transferring the electric charge through a coupling capacitor.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A circuit comprising:
   a switched-capacitor array for converting a digital signal into a corresponding amount of electric charge, said switched-capacitor array including a plurality of capacitors and a summing node to which said plurality of capacitors are connected;
   a continuous-time reconstruction filter circuit; and
   a switching circuit coupled between said summing node and said continuous-time reconstruction filter circuit, said switching circuit supplying an electric charge at the summing node as a pulsed current signal to said continuous-time reconstruction filter circuit without converting into an analog voltage signal.

2. A circuit according to claim 1, further comprises a gain stage coupled between said summing node and said switching circuit, for controlling a gain of said pulsed current signal.

3. A circuit according to claim 2, wherein said gain stage includes a coupling capacitor.

4. A circuit according to claim 3, wherein a capacitance of said coupling capacitor is programmable.

5. A circuit according to claim 1, wherein said continuous-time reconstruction filter circuit includes:
   an input port and an output port;
   at least one amplifier coupled between said input port and said output port;
   a capacitor coupled between an output and an input of said at least one amplifier; and
   a feedback path coupled between said output port and said input port.

6. A circuit according to claim 5, wherein said feed back path of said continuous-time reconstruction filter circuit includes a switched capacitor synchronized with said switching circuit.

7. A circuit according to claim 1, wherein said continuous-time reconstruction filter circuit is a passive filter circuit.

8. A circuit according to claim 1, wherein said continuous-time reconstruction filter circuit is adapted to a line driver for ADSL communications.

9. A DAC interface comprising:
   a plurality of switched capacitors connected into an array, for converting a digital signal into a corresponding amount of electric charge;
   a summing node coupled to said plurality of switched capacitors, for summing up said electric charge from said plurality of switched capacitors; and
   a switching circuit coupled to said summing node, said switching circuit supplying said summed electric charge as a pulsed current signal to a continuous-time reconstruction filter circuit without converting into an analog voltage signal.

10. A circuit according to claim 1, wherein said continuous-time reconstruction filter circuit is adapted to a line driver for ADSL communications.

11. A DAC interface according to claim 10, wherein said gain stage includes a coupling capacitor.

12. A DAC interface according to claim 11, wherein a capacitance of said coupling capacitor is programmable.

13. An apparatus for interfacing a digital signal output and a continuous-time reconstruction filter circuit, said apparatus comprising:
   means for converting a digital signal into a corresponding amount of electric charge; and
   means for supplying said electric charge as a pulsed current signal to said continuous-time reconstruction filter circuit without converting into an analog voltage signal.

14. An apparatus according to claim 13, further comprising means for controlling a gain of said pulsed current signal before supplying to said continuous-time reconstruction filter.

15. An apparatus according to claim 14, wherein said means for controlling includes means for buffering said electric charge.

16. An apparatus according to claim 14, wherein said means for controlling includes a switched capacitor having a programmable capacitance.

17. A method for interfacing a digital signal output and a continuous-time reconstruction filter circuit, said method comprising:
   providing a switched-capacitor array;
   supplying a digital signal to said switched capacitor array so as to convert said digital signal into a corresponding amount of electric charge; and
   supplying said electric charge as a pulsed current signal to said continuous-time reconstruction filter circuit without converting into an analog voltage signal.

18. A method according to claim 17, further comprising controlling a gain of said pulsed current signal before supplying to said continuous-time reconstruction filter.

19. A method according to claim 18, wherein said controlling includes buffering said electric charge in a coupling capacitor.

20. A method according to claim 19, wherein a capacitance of said coupling capacitor is programmable.

* * * * *